United States Patent
Kim et al.

(10) Patent No.: US 9,576,668 B2
(45) Date of Patent: Feb. 21, 2017

(54) SEMICONDUCTOR DEVICE AND OPERATING METHOD THEREOF

(71) Applicant: SK hynix Inc., Icheon-si Gyeonggi-do (KR)

(72) Inventors: Sung Ho Kim, Cheongju-si (KR); Min Sang Park, Cheongju-si (KR); Kyong Taek Lee, Suwon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/970,755

(22) Filed: Dec. 16, 2015

(65) Prior Publication Data
US 2017/0004885 A1    Jan. 5, 2017

(30) Foreign Application Priority Data
Jul. 3, 2015    (KR) .................. 10-2015-0095405

(51) Int. Cl.
| | |
|---|---|
| *G11C 16/04* | (2006.01) |
| *G11C 16/10* | (2006.01) |
| *G11C 16/26* | (2006.01) |
| *G11C 11/56* | (2006.01) |

(52) U.S. Cl.
CPC ........... *G11C 16/10* (2013.01); *G11C 16/0483* (2013.01); *G11C 16/26* (2013.01); *G11C 11/5628* (2013.01)

(58) Field of Classification Search
CPC ..... G11C 16/10; G11C 16/26; G11C 16/0483; G11C 11/5628
USPC ....................................... 365/185.12, 185.19
See application file for complete search history.

(56) References Cited

U.S. PATENT DOCUMENTS

| | | | | |
|---|---|---|---|---|
| 7,813,184 | B2 * | 10/2010 | Kim .................. | G11C 16/0483 |
| | | | | 365/185.11 |
| 8,762,797 | B2 * | 6/2014 | Serebryany ........... | G06F 11/073 |
| | | | | 714/702 |
| 8,923,047 | B2 * | 12/2014 | Choi ...................... | G11C 16/10 |
| | | | | 365/185.05 |
| 9,275,745 | B2 * | 3/2016 | Won ........................ | G11C 7/02 |

FOREIGN PATENT DOCUMENTS

| | | | |
|---|---|---|---|
| KR | 1020090002483 A | 1/2009 |
| KR | 1020100016759 A | 2/2010 |

\* cited by examiner

*Primary Examiner* — Pho M Luu
(74) *Attorney, Agent, or Firm* — William Park & Associates Ltd.

(57) ABSTRACT

The semiconductor device includes a memory block including programmed pages and non-programmed pages, a peripheral circuit configured to perform a read operation of the memory block, and a control circuit configured to control the peripheral circuit so that a read voltage is applied to a word line coupled to a selected page among the pages for the read operation, a first pass voltage is applied to word lines coupled to the programmed pages among pages that are not selected for the read operation, and a second pass voltage lower than the first pass voltage is applied to word lines coupled to non-programmed pages among the pages that are not selected for the read operation.

17 Claims, 11 Drawing Sheets

SEMICONDUCTOR DEVICE AND OPERATING METHOD THEREOF

CROSS-REFERENCE TO RELATED APPLICATION

The present application claims priority to Korean patent application number 10-2015-0095405 filed on Jul. 3, 2015, in the Korean Intellectual Property Office, the entire disclosure of which is incorporated by reference herein.

BACKGROUND

1. Technical Field

The present disclosure generally relates to a semiconductor device and an operating method thereof, and more particularly to a read operation of a semiconductor device.

2. Related Art

A semiconductor memory device is a device that is used to store or program data on a temporary or permanent basis for use in computer or an electronic device. The semiconductor memory device includes a memory cell array for storing data.

The memory cell array may include a plurality of memory blocks. For example, a NAND flash array is grouped into a series of memory blocks, and memory cells constituting the memory blocks are arranged in a plurality of cell strings. Each of the cell strings may include a source select transistor, memory cells, and a drain select transistor. Typically, each cell string constituting a memory block shares word lines, source select lines, and drain select lines. Gates of the source select transistors included in different strings may be connected to a source select line, gates of the memory cells included in different strings may be connected to a word line, and gates of the drain select transistors included in different strings may be connected to a drain select line.

A group of memory cells, among the memory cells included in different cell strings, that are connected to the same word line may be referred to as a page, and a program and read operations may be performed on a page basis.

SUMMARY

The present disclosure has been made in an effort to provide a semiconductor device capable of improving reliability of a read operation and an operating method thereof.

An embodiment of the present disclosure provides a semiconductor device, including a memory block including programmed pages and non-programmed pages; a peripheral circuit configured to perform a read operation of the memory block; and a control circuit configured to control the peripheral circuit so that a read voltage is applied to a word line coupled to a selected page among the pages for the read operation, a first pass voltage is applied to word lines coupled to the programmed pages among pages that are not selected for the read operation, and a second pass voltage lower than the first pass voltage is applied to word lines coupled to non-programmed pages among the pages that are not selected for the read operation.

An embodiment of the present disclosure provides a method of operating a semiconductor device, including applying a first pass voltage to word lines connected to a first page group of a selected memory block, applying a second pass voltage lower than the first pass voltage to word lines connected to a second page group of the selected memory block, and reading memory cells included in a third page group by applying a read voltage to a word line connected to the third page group of the selected memory block.

An embodiment of the present disclosure provides a method of operating a semiconductor device, including storing addresses of programmed pages among pages included in a selected memory block during a program operation, and applying a read voltage to a word line connected to a selected page among the pages and applying a first pass voltage to word lines connected to the remaining non-selected pages during a read operation, in such a manner that a second pass voltage lower than the first pass voltage is applied to word lines connected to the programmed pages among the non-selected pages according to the address.

According to the exemplary embodiment of the present disclosure, it is possible to improve reliability of a read operation of a memory block, in which a program operation is not completed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Hereinafter, example embodiments of the present disclosure will be described in detail with reference to the accompanying drawings. However, the present disclosure is not limited to embodiments to be disclosed below, but various forms different from each other may be implemented.

Figure 1:
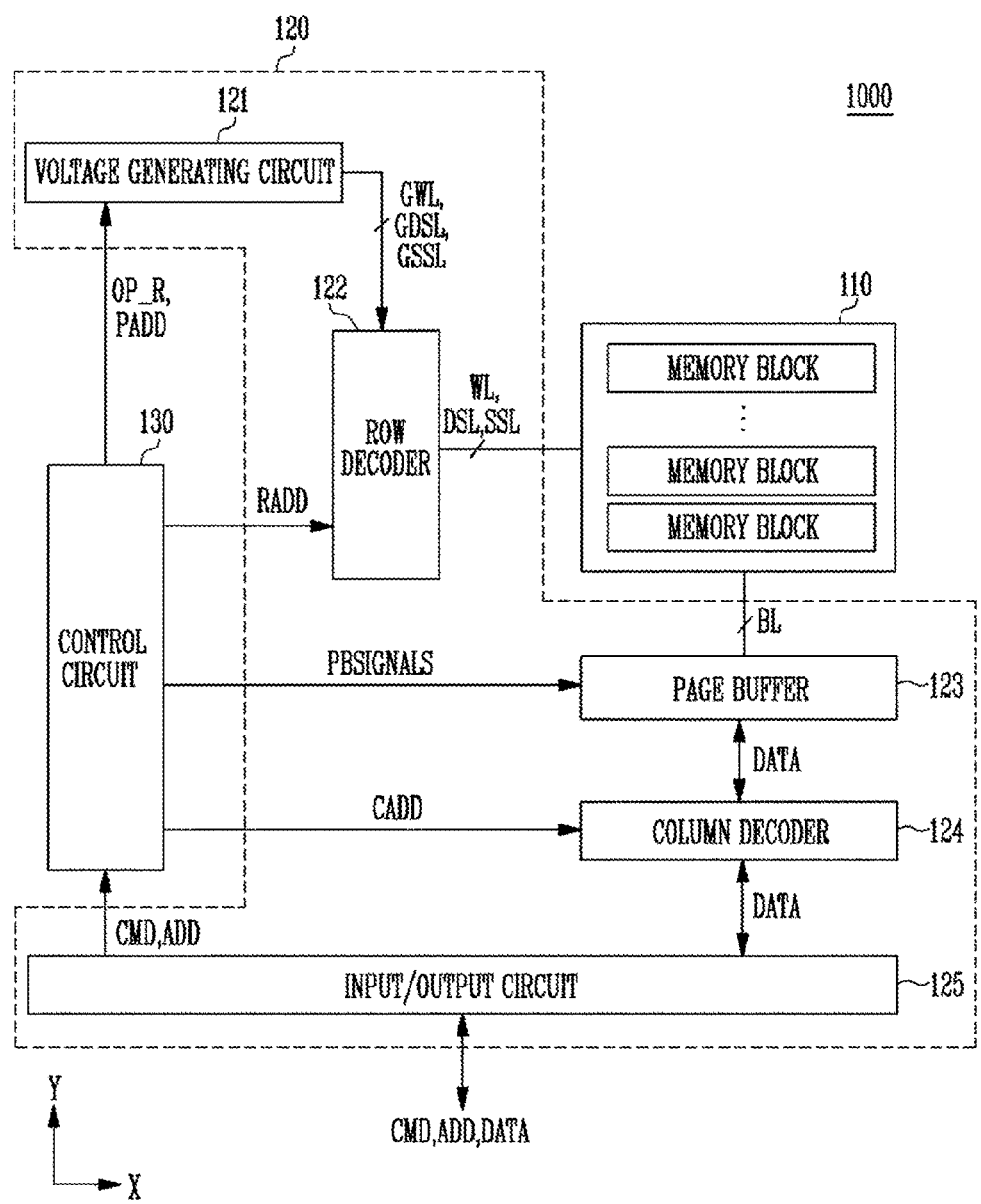
FIG. 1 is a diagram for schematically describing a semiconductor device according to an example embodiment of the present disclosure.

FIG. 1 is a diagram for schematically describing a semiconductor device according to an example embodiment of the present disclosure.

Referring to FIG. 1, a semiconductor device 1000 includes a memory cell array 110, a peripheral circuit 120 for performing program, read, and erase operations on the memory cell array 110, and a control circuit 130 for controlling the peripheral circuit 120.

The memory cell array 110 includes a plurality of memory blocks. Each of the memory blocks includes a plurality of cell strings, each of which is formed of a plurality of memory cells. The plurality of cell strings may be formed in a two-dimensional structure in which the plurality of memory cells is horizontally arranged on a substrate. The plurality of cell strings may also be formed in a three-dimensional structure in which the plurality of memory cells is vertically arranged on a substrate. Unlike a single-level-cell (SLC) flash memory which stores one bit of data per cell, multi-level-cell (MLC) flash memory stores two bits of data per cell. Likewise, triple-level-cell (TLC) flash memory stores three bits of data per cell, and quadruple-level-cell (QLC) flash memory stores four bits of data per cell. A group of memory cells coupled to the same word line, among the memory cells included in different strings, is referred to as a page.

The peripheral circuit 120 includes a voltage generating circuit 121, a row decoder 122, a page buffer 123, a column decoder 124, and an input/output circuit 125.

The voltage generating circuit 121 generates various voltages as operating voltages. For example, the voltage generating circuit 121 generates operating voltages such as a read voltage, a first pass voltage, a second pass voltage, a drain turn-on voltage, and a source turn-on voltage in response to a read operation signal OP_R and a page address PADD, and transmits the operating voltages to global word lines GWL, global drain select lines GDSL, and global source select lines GSSL. The page address PADD may include, among the pages of the selected memory block, addresses of pages that are selected for a read operation and addresses of pages on which a program operation has been completed. The read voltage, the first pass voltage, and the second pass voltage may be applied to the global word lines GWL, the drain turn-on voltage may be applied to the global drain select lines GSL, and the source turn-on voltage may be applied to the global source select lines GSSL.

The row decoder 122 is coupled to the voltage generating circuit 121 through the global word lines GWL, the global drain select lines GSL, and the global source select lines GSSL. The row decoder 122 is also coupled to the memory cell array 110 through the word lines WL, the drain select lines DSL, and the source select lines SSL. The row decoder 122 transmits the operating voltages generated by the voltage generating circuit 121 to a selected memory block included in the memory cell array 110 in response to a row address RADD. For example, the row decoder 122 transmits the voltages applied to the global word lines GWL to the word lines WL, the voltages applied to the global drain select lines GDSL to the drain select lines DSL, and the voltages applied to the global source select lines GSSL to the source select lines SSL.

The page buffer 123 is coupled to the memory cell array 110 through bit lines BL. The page buffer 123 precharges the bit lines in response to a page buffer control signal PBSIG-NALS, provides data received through the input/output circuit 125 and the column decoder 124 to the memory cell array 110 during a program operation, and temporarily stores data read from the memory cell array 110 before outputting the data to the input/output circuit 125.

The column decoder 124 provides data DATA received from the input/output circuit 125 to page buffer 123 and provide data DATA received from the page buffer 123 to the input/output circuit 125 in response to a column address CADD.

The input/output circuit 125 transmits a command CMD and the address ADD received from outside the semiconductor device 1000, transmits data DATA received from outside the semiconductor device 1000 to the column decoder 124, outputs the data DATA received from the column decoder 124 to the outside, and transmits the command CMD and the address ADD to the control circuit 130.

The control circuit 130 controls the peripheral circuit 120 in response to the command CMD and the address ADD. During the program operation, the control circuit 130 stores addresses (e.g., page addresses) of the pages on which the program operation has been completed. During the read operation, the control circuit 130 controls the peripheral circuit 120 so that the read voltage is applied to a selected word line and the first and second pass voltages are applied to the non-selected word lines.

The aforementioned read operation may be applied to both a two-dimensional semiconductor device and a three-dimensional semiconductor device, and each semiconductor memory device will be described in detail below.

Figure 2:
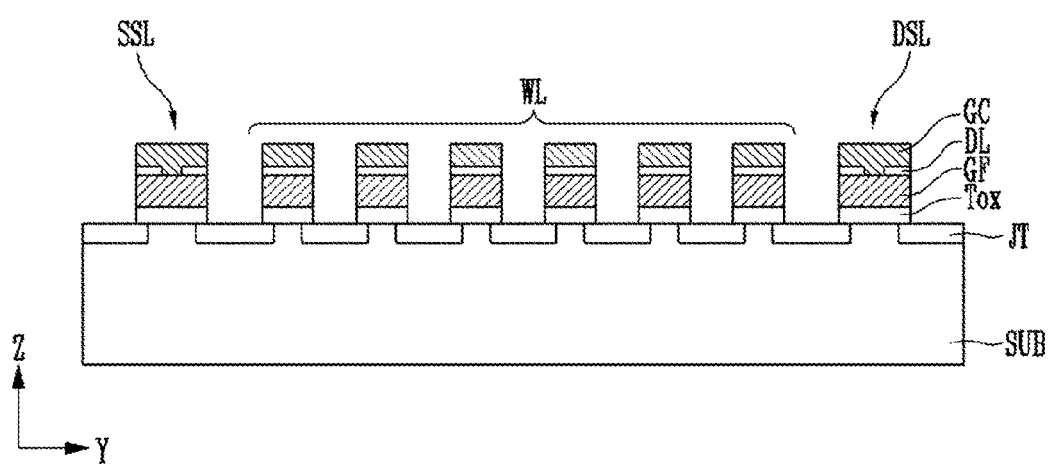
FIG. 2 is a cross-sectional view for describing a cell string of a two-dimensional semiconductor device.

FIG. 2 is a cross-sectional view for describing a cell string of a two-dimensional semiconductor device.

Referring to FIG. 2, a two-dimensional semiconductor device according to an example embodiment includes cell strings arranged horizontally (Y-direction) on a substrate SUB. Each cell string may include a source select transistor, memory cells, and a drain select transistor. A junction region JT is formed on a substrate SUB between the source select transistor, the memory cells, and the drain select transistor.

The source select transistor, the memory cells, and the drain select transistor may include tunnel insulating layers Tox, floating gates GF, dielectric layers DL, and control gates GC sequentially stacked on the substrate. The tunnel insulating layers Tox may be formed of an oxide layer. The floating gates GF and the control gates GC may be formed of a doped polysilicon layer. The dielectric layers DL may be formed in a stack structure of an oxide layer, a nitride layer, and an oxide layer, or of a high dielectric (high-k) layer. The control gates GC of the source select transistors are coupled to the source select lines SSL, the control gates GC of the memory cells are coupled to the word lines WL, and the control gates GC of the drain select transistors are coupled to the drain select lines DSL. A part of the dielectric layers DL is removed in the source select transistors coupled to the source select lines SSL and the drain select transistors coupled to the drain select lines DSL, so that the floating gates GF may be in contact with the control gates GC. The floating gates GF and the control gates GC may be isolated from each other by the dielectric layers DL.

Figure 3:
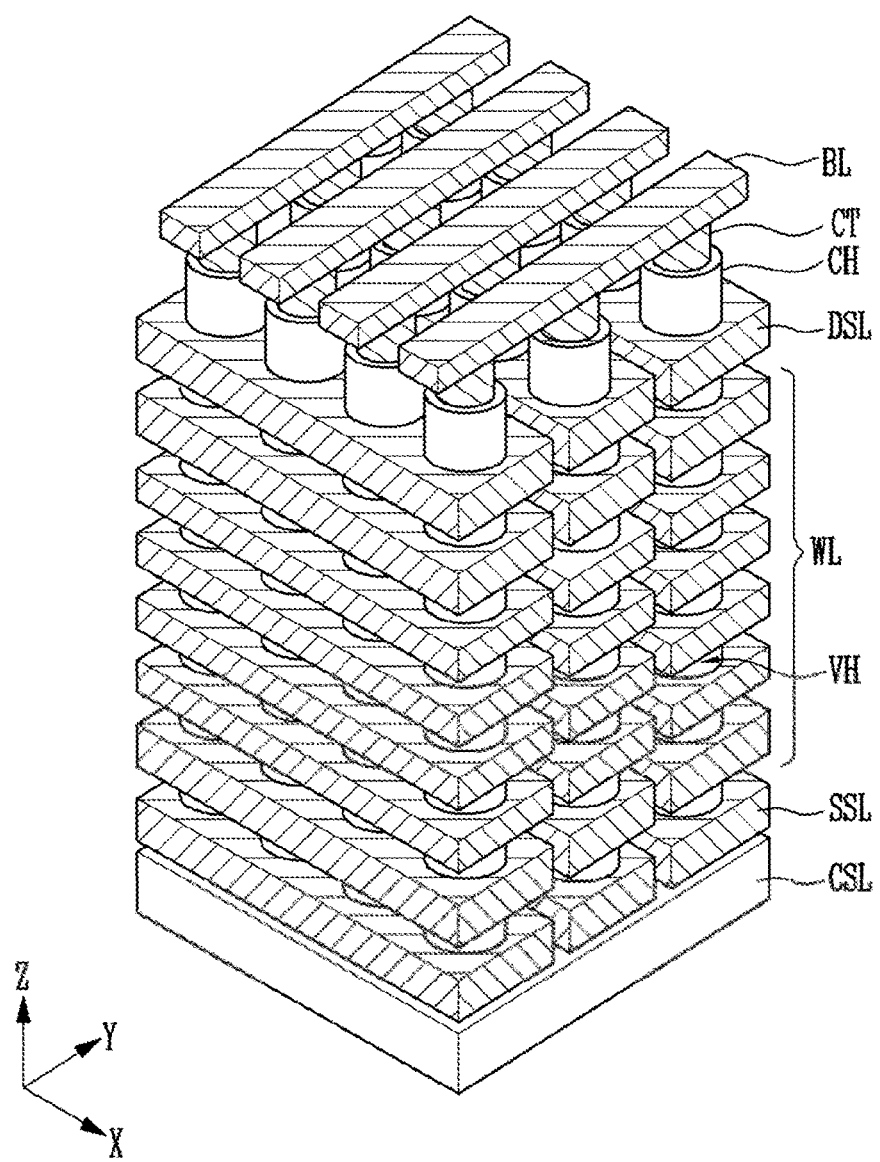
FIG. 3 is a perspective view for describing a cell string of a three-dimensional semiconductor device.

FIG. 3 is a perspective view for describing a cell string of a three-dimensional semiconductor device.

Referring to FIG. 3, a three-dimensional semiconductor memory device according to an example embodiment includes a plurality of cell strings formed on a substrate (not illustrated) in a vertical direction (Z-direction). The cell strings may be formed in a structure vertically arranged between bit lines BL and a common source line CSL. In an embodiment, the three-dimensional semiconductor memory device may have Bit Cost Scalable (BiCS) structure. For example, the three-dimensional semiconductor memory device in accordance with en embodiment may be formed in a way that the common source line CSL is horizontally formed on the substrate, and the cell strings having the BiCS structure are formed in a vertical direction on the common source line CSL. The cell strings include source select lines SSL, word lines WL, and drain select lines DSL vertically stacked (Z-direction) while being spaced apart from each other, and vertical channel layers CH vertically passing through the source select lines SSL, the word lines WL, and the drain select lines DSL are in contact with the common source line CSL. The bit lines BL extending in the Y-direction are in contact with upper portions of the vertical channel layers CH protruding from upper portions of the drain select lines DSL. The drain select lines DSL extend in the X-direction while being spaced apart from each other in the Y-direction. The source select lines SSL also extend in the X-direction while being spaced apart from each other in the Y-direction. A contact plug CT may also be further formed between the bit lines BL and the vertical channel layers CH.

The two-dimensional and three-dimensional semiconductor memory devices in accordance with embodiments of the present invention are not limited to those illustrated in FIGS. 2 and 3, and thus the cell string may be differently configured according to the types of semiconductor devices.

Figure 4:
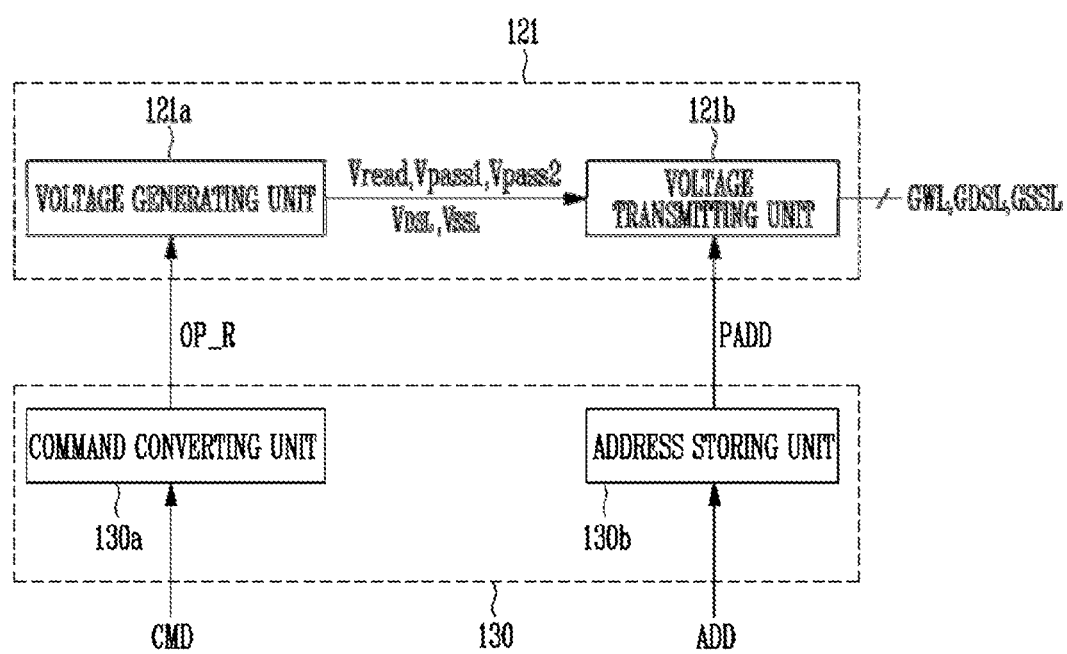
FIG. 4 is a diagram for describing a voltage generating circuit and a control circuit of FIG. 1 in detail.

FIG. 4 is a diagram for describing the voltage generating circuit and the control circuit of FIG. 1 in detail.

Referring to FIG. 4, the voltage generating circuit 121 may include a voltage generating unit 121a and a voltage transmitting unit 121b, and the control circuit 130 may include a command converting unit 130a and an address storing unit 130b.

The command converting unit 130a receives a command CMD, converts the command CMD into an operation signal, and output the operation signal. For example, during the read operation, the command converting unit 130a outputs a read operation signal OP_R in response to the command CMD.

The address storing unit 130b receives an address ADD during the program operation and stores page addresses PADD of pages on which the program operation has been completed. During the read operation, the address storing unit 130b provides the page address PADD of the memory block selected for the read operation to the voltage generating unit 121. For example, the address storing unit 130b may store, among the pages in the memory block in which the program operation is performed, page addresses of pages on which the program operation has been completed. Further, the address storing unit 130b may store the addresses of pages that are selected for the read operation.

The voltage generating unit 121a generates a read voltage Vread, a first pass voltage Vpass1, a second pass voltage Vpass2, a drain turn-on voltage VDSL, and a source turn-on voltage VSSL required for the read operation in response to the read operation signal OP_R, and supplies the generated voltages Vread, Vpass, Vpass2, VDSL, and VSSL to the voltage transmitting unit 121b. The first pass voltage Vpass1 is a voltage that is applied to non-selected word lines of the programmed pages and set based on the states of the programmed memory cells. The second pass voltage Vpass2 is a voltage that is applied to non-selected word lines of non-programmed pages and set to a positive voltage lower than the first pass voltage Vpass1.

The voltage transmitting unit 121b applies the read voltage Vread, the first pass voltage Vpass1, and the second pass voltage Vpass2 to the global word lines GWL in response to the page address PADD, applies the drain turn-on voltage VDSL to the global drain select lines GDSL, and applies the source turn-on voltage VSSL to the global source select lines GSSL.

In an embodiment, the global word lines GWL may be divided into a first global word line group, a second global word line group, and a third global word line group. The first global word line group and the second global word line group include all remaining non-selected global word lines except for the selected global word lines among the global word lines GWL. The third global word line group includes the selected global word line.

The non-selected global word lines included in the first global word line group correspond to the word lines coupled to, among pages in the selected memory block, the pages on which the program operation has been completed (hereinafter referred to as a first word line group). The non-selected global word lines included in the second global word line group correspond to the word lines coupled to, among pages in the selected memory block, the pages on which the program operation has not been performed (hereinafter referred to as a second word line group). The non-selected global word lines included in the third global word line group correspond to the word lines coupled to, among pages in the selected memory block, the pages selected for the read operation (hereinafter referred to as a third word line group).

Figure 5:
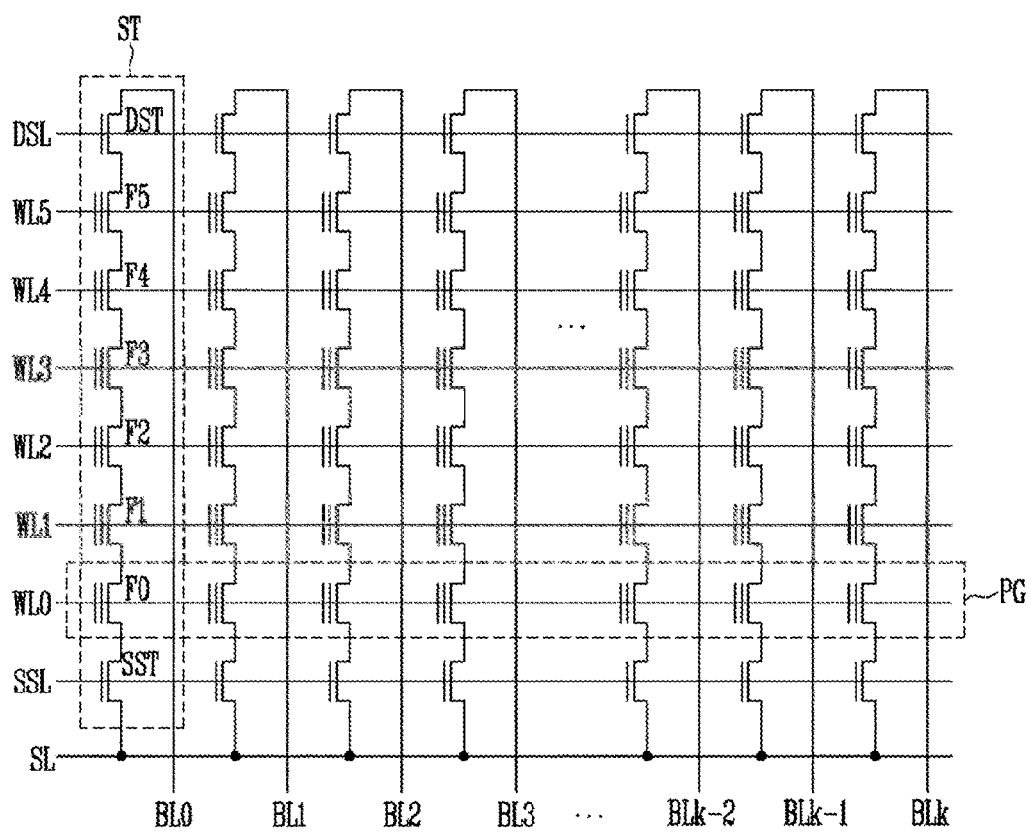
FIG. 5 is a diagram for describing a memory block according to an example embodiment of the present disclosure in detail.

FIG. 5 is a diagram for describing a memory block according to the exemplary embodiment of the present disclosure in detail, and illustrates the memory block included in the aforementioned two-dimensional semiconductor memory device as an exemplary embodiment.

Referring to FIG. 5, the memory block includes a plurality of cell strings ST coupled between the source line SL and bit lines BL0 to BLk. The cell strings ST may include source select transistors SST, memory cells F0 to F5, and drain select transistors DST coupled in series to each other between the source line SL and the bit lines BL0 to BLk. Sources of the source select transistors SST are coupled to the source line SL, and drains of the drain select transistors DST are coupled to the bit lines BL0 to BLk. Although, for purposes of disclosure, only six memory cells F0 to F5 have been chosen as the memory cells constituting the cell string ST, it will be understood that the cell strings ST may have more memory cells.

Gates of the source select transistors SST included in different cell strings ST are coupled to a source select line SSL, gates of the memory cells F0 to F5 are coupled to word lines WL0 to WL5, and gates of the drain select transistors DST are coupled to a drain select line DSL. A group of memory cells coupled to the same word line is referred to as a page PG.

The program operation of the semiconductor device may be performed in an order from memory cells F0 adjacent to the source select transistors SST to memory cells F5 adjacent to the drain select transistors DST. In general, the program operation of a selected memory block continues until the program operations of all of the pages of the selected memory block have been completed. However, there may be situations where the program operation has been completed only on some of the pages of the selected memory block. If the program operations have been completed on all the pages of a memory block, the memory block is referred to as a closed block, and if a memory block has one or more pages on which the program operations have not been performed, the memory block is referred to as an open block.

The read and program operations involve applying high voltages on page basis, and thus there is a probability that voltages applied while performing the read and program operations on a selected page can affect threshold voltages of unselected pages. For example, when a read operation is performed on the open block, which includes the programmed pages and the non-programmed pages, a pass voltage is applied to the non-selected word lines, and this may affect threshold voltages of the unselected pages due to a difference in threshold voltages of the memory cells. In an embodiment, during the read operation of the selected memory block, a first pass voltage is applied to the non-selected word lines coupled to the programmed pages, and a second pass voltage lower than the first pass voltage is applied to the non-selected word lines coupled to the non-programmed pages.

The read operation will be described in detail below.

FIGS. 6 to 9 are diagrams for describing a read operation according to an example embodiment of the present disclosure.

Figure 6:
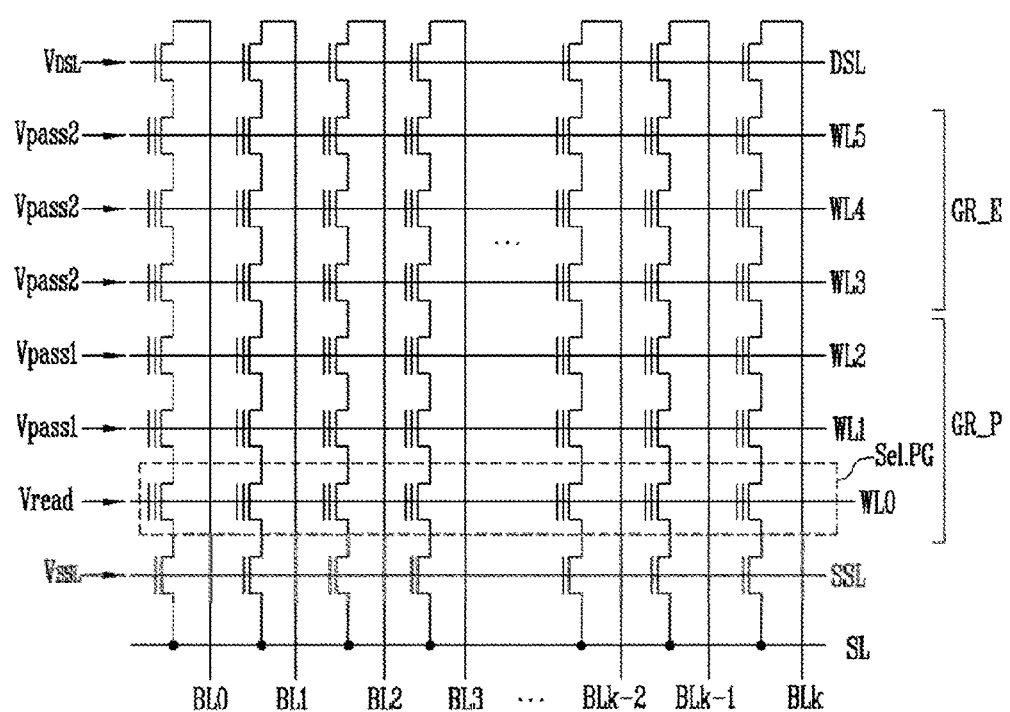
FIGS. 6 to 9 are diagrams for describing a read operation according to an example embodiment of the present disclosure.

Referring to FIG. 6, it is assumed that the selected memory block include first to sixth pages, and first to third pages are included in a programmed page group GR_P, and third to fifth pages are included in a non-programmed page group GR_E.

When the first word line WL0 is a selected word line, the read operation is performed as described below.

A positive voltage is applied to the bit lines BL0 to BLk in order to precharge the bit lines BL0 to BLk. When all of the bit lines BL0 to BLk are precharged, the read voltage Vread is applied to the selected first word line WL0, the first pass voltage Vpass1 is applied to the second and third word lines WL1 and WL2 coupled to the programmed page group GR_P, and the second pass voltage Vpass2 lower than the first pass voltage Vpass1 is applied to the fourth to sixth word lines WL3 to WL5 coupled to the non-programmed page group GR_E. The source turn-on voltage VSSL is applied to the source select line SSL, and the drain turn-on voltage VDSL is applied to the drain select line DSL. The source turn-on voltage VSSL and the drain turn-on voltage VDSL may be set to voltages that allow the source select transistors SST and the drain select transistors DST to be turned on. After a certain time, voltages of the bit lines BL0 to BLk are sensed, and then the read operation of the first page is terminated.

Figure 7:
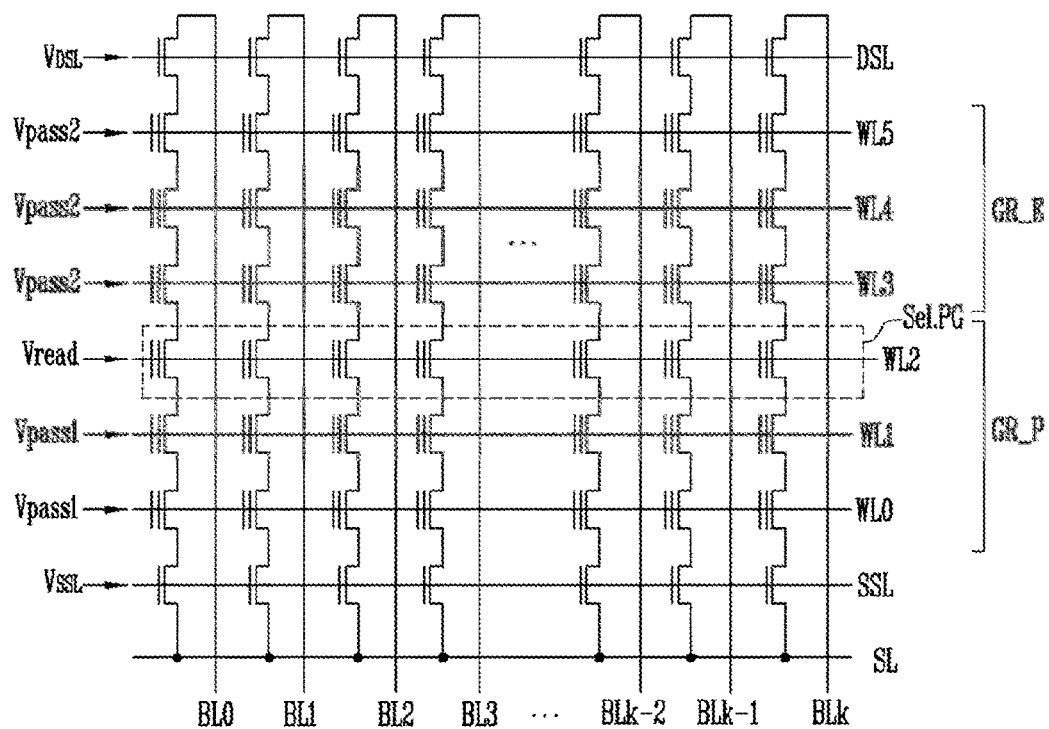

Referring to FIG. 7, when the third word line WL2 is a selected word line, the read operation is performed as described below.

A positive voltage is applied to the bit lines BL0 to BLk in order to precharge the bit lines BL0 to BLk. When all of the bit lines BL0 to BLk are precharged, the read voltage Vread is applied to the selected third word line WL2, the first pass voltage Vpass1 is applied to the first and second word lines WL0 and WL1 coupled to the programmed page group GR_P, and the second pass voltage Vpass2 lower than the first pass voltage Vpass1 is applied to the fourth to sixth word lines WL3 to WL5 coupled to the non-programmed page group GR_E. The source turn-on voltage VSSL is applied to the source select line SSL, and the drain turn-on voltage VDSL is applied to the drain select line DSL. After a certain time, voltages of the bit lines BL0 to BLk are sensed, and then the read operation of the third page is terminated.

As described above, if the read operation is performed on the memory block on which the program operation has been performed and is the open block, the first pass voltage Vpass1 is applied to the non-selected word lines coupled to the programmed page group GR_P and the second pass voltage Vpass lower than the first pass voltage Vpass1 is applied to the non-selected word lines coupled to the non-programmed page group GR_E during the read operation of the selected page. When the second pass voltage Vpass2 having a low level is applied to the non-selected word lines coupled to the non-programmed memory cells, channel resistance of the non-programmed memory cells are increased to a level of channel resistance of the programmed memory cells. Accordingly, channel current of the cell strings included in the selected memory block are decreased, thereby minimizing a change in a threshold voltage distribution of the memory cells. Accordingly, reliability of the read operation of the semiconductor device may be improved.

The read operation of the open block is performed on the programmed pages, but the read operation may also be performed on the non-programmed pages. In this case, the read operation may be performed as illustrated in FIGS. 8 and 9.

Figure 8:
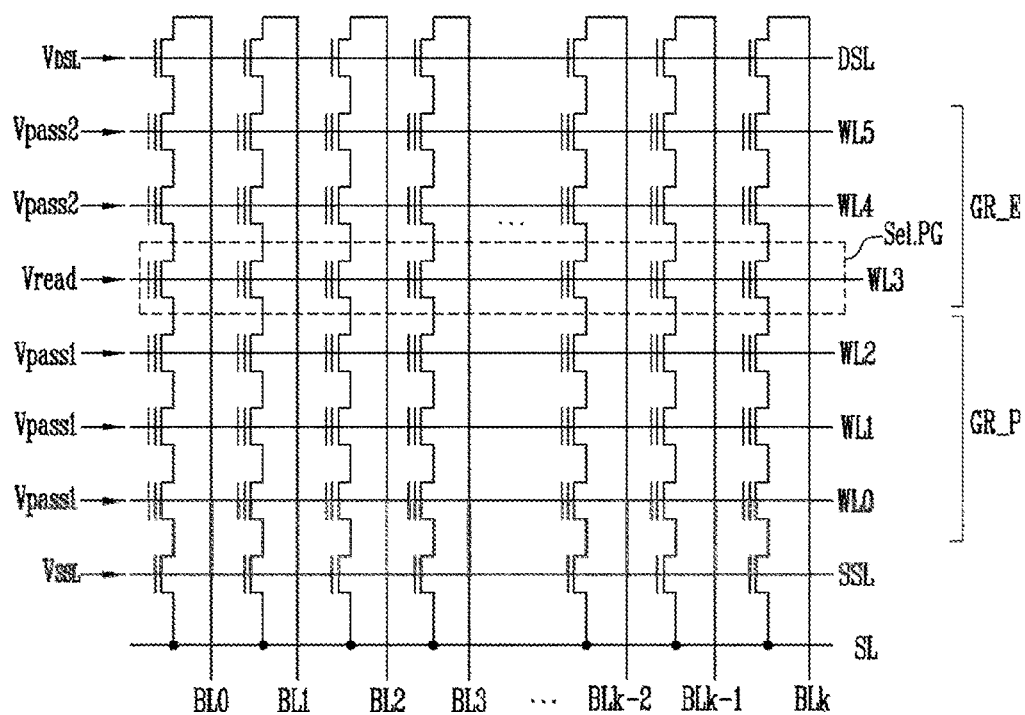

Referring to FIG. 8, when the third word line WL3 is a selected word line, the read operation is performed as described below.

A positive voltage is applied to the bit lines BL0 to BLk in order to precharge the bit lines BL0 to BLk. When all of the bit lines BL0 to BLk are precharged, the read voltage Vread is applied to the selected fourth word line WL3, the first pass voltage Vpass1 is applied to the first to third word lines WL0 and WL2 coupled to the programmed page group GR_P, and the second pass voltage Vpass2 lower than the first pass voltage Vpass1 is applied to the fifth and sixth word lines WL4 and WL5 coupled to the non-programmed page group GR_E. The source turn-on voltage VSSL is applied to the source select line SSL, and the drain turn-on voltage VDSL is applied to the drain select line DSL. After a certain time, voltages of the bit lines BL0 to BLk are sensed, and then the read operation of the third page is terminated.

Figure 9:
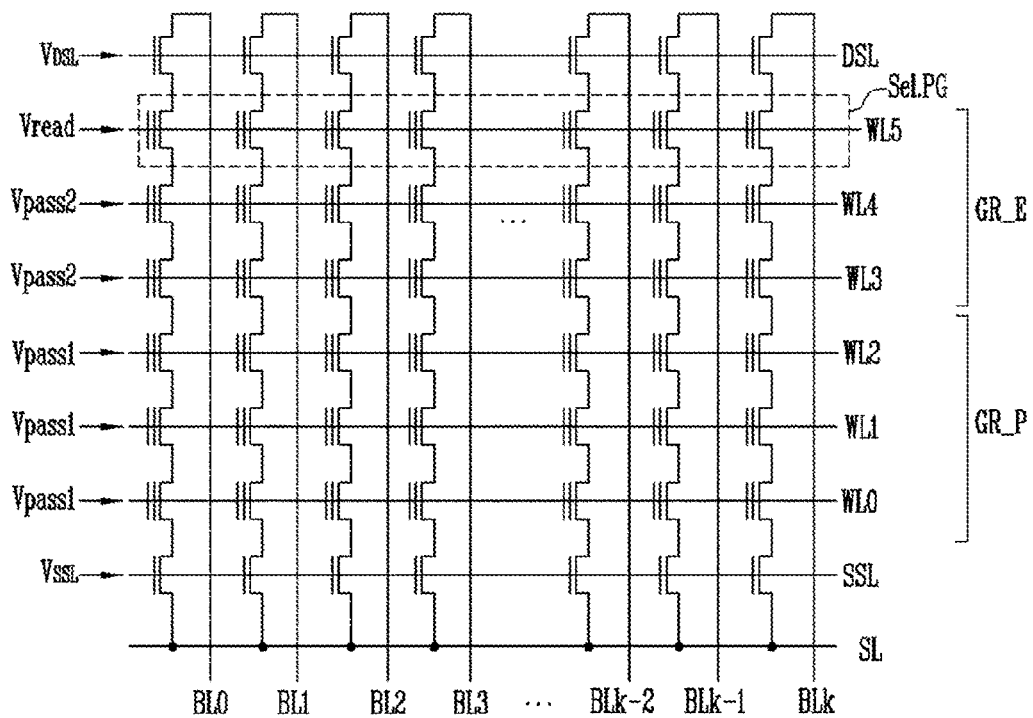

Referring to FIG. 9, when the fifth word line WL5 is a selected word line, the read operation is performed as described below.

A positive voltage is applied to the bit lines BL0 to BLk in order to precharge the bit lines BL0 to BLk. When all of the bit lines BL0 to BLk are precharged, the read voltage Vread is applied to the selected fifth word line WL5, the first pass voltage Vpass1 is applied to the first to third word lines WL0 and WL2 coupled to the programmed page group GR_P, and the second pass voltage Vpass2 lower than the first pass voltage Vpass1 is applied to the fourth and fifth word lines WL3 and WL4 coupled to the non-programmed page group GR_E. The source turn-on voltage VSSL is applied to the source select line SSL, and the drain turn-on voltage VDSL is applied to the drain select line DSL. After a certain time, voltages of the bit lines BL0 to BLk are sensed, and then the read operation of the second page is terminated.

The read operation of the two-dimensional semiconductor device has been described with reference to FIGS. 6 to 9, but the read operation of the three-dimensional semiconductor device including the memory block illustrated in FIG. 3 may be performed by the aforementioned method.

Further, in FIGS. 6 to 9, the pages included in the programmed page group GR_P and the non-programmed page group GR_E are sequentially adjacent to each other, but the programmed pages and the non-programmed pages may also be adjacent to each other regardless of an order.

Figure 10:
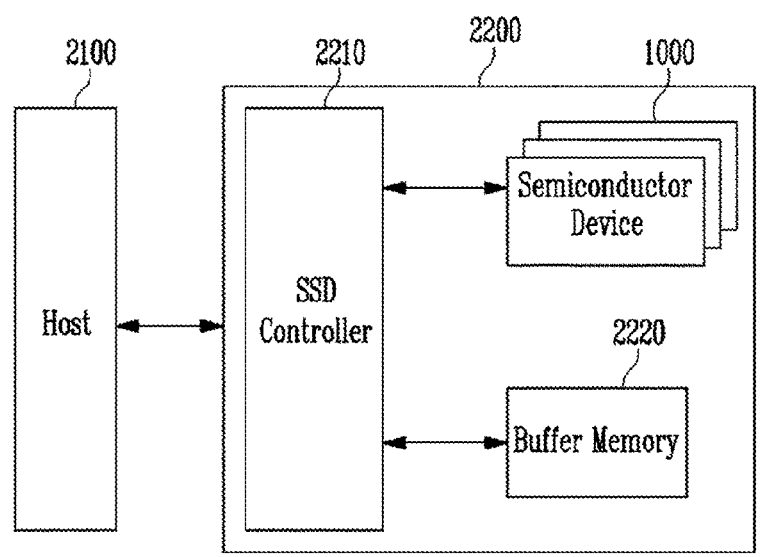
FIG. 10 is a block diagram for describing a solid state drive including the semiconductor device according to an example embodiment of the present disclosure.

FIG. 10 is a block diagram for describing a solid state drive including the semiconductor device according to an example embodiment of the present disclosure.

Referring to FIG. 10, a drive device 2000 includes a host 2100 and a Solid State Disk (SSD) 2200. The SSD 2200 includes an SSD controller 2210, a buffer memory 2220, and a semiconductor device 1000.

The SSD controller 2210 connects the host 2100 and the SSD 2200. That is, the SSD controller 2210 provides an interface between the SSD 2200 and the host 2100 in accordance with a bus format of the host 2100. The SSD controller 2210 decodes a command provided from the host 2100. The SSD controller 2210 accesses the semiconductor device 1000 according to a result of the decoding. The bus format of the host 2100 may include a Universal Serial Bus (USB), a Small Computer System Interface (SCSI), PCI process, ATA, Parallel ATA (PATA), Serial ATA (SATA), and Serial Attached SCSI (SCSI).

Program data provided from the host 2100 and data read from the semiconductor device 1000 is temporarily stored in the buffer memory 2220. When data existing in the semiconductor device 1000 is cached when a read request is made from the host 2100, the buffer memory 2200 supports a cache function of directly providing the cached data to the host 2100. In general, a data transmission speed of the bus format (e.g., SATA or SAS) provided by the host 2100 may be larger than a transmission speed of a memory channel of the SSD 2200. That is, if the data transmission speed at an interface of the host 2100 is faster than the data transmission speed of the memory channel of the SSD 2200, it is possible to minimize the performance degradation due to a difference in the data transmission speed by providing the buffer memory 2220 with large capacity. The buffer memory 2220 may include a synchronous DRAM so that the SSD 2200 used as an auxiliary memory device with large capacity provides sufficient buffering.

The semiconductor device 1000 is provided as a storage medium of the SSD 2200. For example, the semiconductor device 1000 may include a non-volatile memory device having large data storage capacity such as a NAND-type flash memory.

Figure 11:
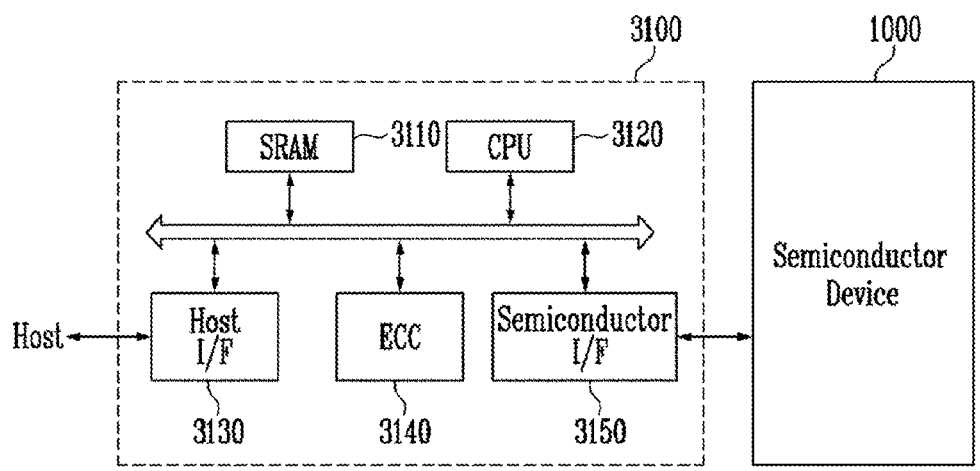
FIG. 11 is a block diagram for describing a memory system including the semiconductor device according to an example embodiment of the present disclosure.

FIG. 11 is a block diagram for describing a memory system including the semiconductor device according to an example embodiment of the present disclosure.

Referring to FIG. 11, a memory system 3000 according to the present disclosure may include a memory controller 3100 and the semiconductor device 1000.

The semiconductor device 1000 may have a configuration substantially the same as that of FIG. 1, so that a detailed description of the semiconductor device 1000 will be omitted.

A memory controller 3100 may perform reading and writing operations to the semiconductor device 1000. The SRAM 3110 may be used as a working memory of a CPU 3120. A host interface 3130 may include a data exchange protocol of a host coupled to the memory system 3000. An error correction circuit (ECC) 3140 provided in the memory controller 3100 may detect and correct an error included in data read from the semiconductor device 1000. A semiconductor interface 3150 may interface with the semiconductor device 1000. The CPU 3120 may perform a control operation for data exchange of the memory controller 3100. Further, although not illustrated in FIG. 11, the memory system 3000 may further include a ROM (not illustrated) for storing code data for interfacing with the host.

The memory system 3000 according to an embodiment of the present disclosure may be applied to a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder, a digital picture player, a digital video recorder, a digital video player, a device capable of transceiving information in a wireless environment, and one of various devices configuring a home network.

Figure 12:
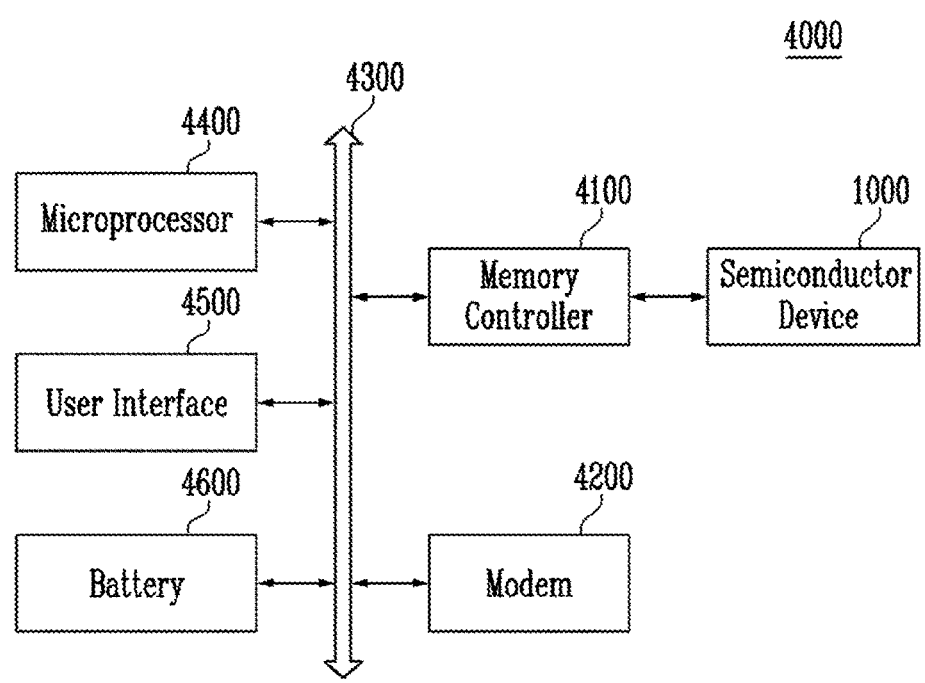
FIG. 12 is a diagram for describing a schematic configuration of a computer system including the semiconductor device according to an example embodiment of the present disclosure.

FIG. 12 is a diagram for describing a schematic configuration of a computer system including the semiconductor device according to an example embodiment of the present disclosure.

Referring to FIG. 12, a computer system 4000 according to an embodiment of the present disclosure includes the semiconductor device 1000, a memory controller 4100, a modem 4200, a microprocessor 4400, and a user interface 4500 electrically coupled to the bus 4300. In a case where the computer system 4000 according to an embodiment of the present disclosure is a mobile device, a battery 4600 for supplying an operating voltage of the computer system 4000 may be further provided. Although it is not illustrated in the drawing, the computer system 4000 according to the present disclosure may further include an application chipset, a Camera Image Processor (CIS), a mobile DRAM, and the like.

The semiconductor device 1000 may have a configuration the same or substantially the same as that of FIG. 1, so that a detailed description of the semiconductor device 1000 will be omitted.

The memory controller 4100 and the semiconductor device 1000 may configure an SSD.

The semiconductor device and the memory controller according to an embodiment of the present disclosure may be embedded by using various forms of packages. For example, the semiconductor device and the memory controller according to an embodiment of the present disclosure may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

As described above, the embodiment has been disclosed in the drawings and the specification. The specific terms used herein are for purposes of illustration, and do not limit the scope of the present disclosure defined in the claims. Accordingly, those skilled in the art will appreciate that various modifications and another equivalent example may be made without departing from the scope and spirit of the present disclosure. Therefore, the sole technical protection scope of the present disclosure will be defined by the technical spirit of the accompanying claims.

What is claimed is:

1. A semiconductor device, comprising:
a memory block including programmed pages and non-programmed pages;
a peripheral circuit configured to provide a read voltage, a first pass voltage, and a second pass voltage during a read operation of the memory block; and
a control circuit configured to control the peripheral circuit so that a read voltage is applied to a word line coupled to a selected page among the pages for the read operation, a first pass voltage is applied to word lines coupled to the programmed pages among pages that are not selected for the read operation, and a second pass voltage lower than the first pass voltage is applied to word lines coupled to non-programmed pages among the pages that are not selected for the read operation.

2. The semiconductor device of claim 1, wherein the peripheral circuit includes:
a voltage generating circuit configured to generate the read voltage, the first pass voltage, and the second pass voltage, and transmit the generated voltages to global word lines in response to a read operation signal and a page address;
a row decoder configured to transmit the voltages received through the global word lines to the word lines of the memory block according to a row address;
a page buffer configured to precharge bit lines coupled to the memory block and transmit/receive data through the bit lines in response to a page buffer control signal;
a column decoder configured to transmit/receive data with the page buffer according to a column address; and
an input/output circuit configured to receive a command and an address, and transmit/receive data with the input/output circuit.

3. The semiconductor device of claim 2, wherein the voltage generating circuit includes:
a voltage generating unit configured to generate the read voltage, the first pass voltage, and the second pass voltage in response to the read operation signal; and
a voltage transmitting unit configured to transmit the read voltage, the first pass voltage, and the second pass voltage to the global word lines according to the page address.

4. The semiconductor device of claim 3, wherein the voltage generating unit generates the second pass voltage with a positive voltage lower than the first pass voltage.

5. The semiconductor device of claim 3, wherein the voltage transmitting unit transmits the read voltage to a global word line corresponding to the selected page, transmits the first pass voltage to global word lines corresponding to the programmed pages, and transmits the second pass voltage to global word lines corresponding to the non-programmed pages according to the page address.

6. The semiconductor device of claim 1, wherein the control circuit includes:
a command converting unit configured to output the read operation signal in response to a command received from outside the semiconductor device; and
an address storing unit configured to store the page address corresponding to page addresses of memory cells programmed during a program operation, and output the page address during the read operation.

7. The semiconductor device of claim 6, wherein the address storing unit transmits an address of the selected page to the voltage generating circuit together with the page address during the read operation.

8. The semiconductor device of claim 1, wherein the pages are included in a plurality of cell strings formed in a two-dimensional or three-dimensional structure, and the pages include memory cells coupled to the same word lines.

9. The semiconductor device of claim 8, wherein the cell strings formed in the two-dimensional structure are horizontally arranged with respect to a substrate, and include source select transistors, memory cells, and drain select transistors, which are coupled in series to each other between a source line and bit lines.

10. The semiconductor device of claim 8, wherein the cell strings formed in the three-dimensional structure are vertically arranged with respect to a substrate, and include source select transistors, memory cells, and drain select transistors, which are coupled in series to each other between a source line and bit lines.

11. A method of operating a semiconductor device, comprising:
applying a first pass voltage to word lines coupled to a first page group of a selected memory block;
applying a second pass voltage lower than the first pass voltage to word lines coupled to a second page group of the selected memory block; and
reading memory cells included in a third page group by applying a read voltage to a word line coupled to the third page group of the selected memory block.

12. The method of claim 11, wherein the first page group is formed of programmed pages.

13. The method of claim 11, wherein the second page group is formed of non-programmed pages.

14. The method of claim 11, wherein the second pass voltage is a positive voltage.

15. The method of claim 11, further comprising precharging bit lines by applying a positive voltage to the bit lines coupled to the selected memory block before the applying of the first pass voltage to the word lines coupled to the first page group.

16. A method of operating a semiconductor device, comprising:
storing addresses of programmed pages included in a selected memory block during a program operation; and
applying a read voltage to a word line coupled to a selected page and applying first and second pass voltages to word lines coupled to remaining non-selected pages during a read operation, the first pass voltage being applied to word lines coupled to non-programmed pages, and the second pass voltage lower than the first pass voltage being applied to word lines coupled to the programmed pages.

17. The method of claim 16, wherein the second pass voltage is a positive voltage.

* * * * *